United States Patent [19]

Masuda et al.

[11] Patent Number: 4,900,924
[45] Date of Patent: Feb. 13, 1990

[54] REFERENCE SIGNAL GENERATION APPARATUS FOR POSITION DETECTOR

[75] Inventors: Yutaka Masuda, Hirakata; Norio Okutani, Neyagawa, both of Japan

[73] Assignee: Matsushita Electric Industrial Co., Ltd., Osaka, Japan

[21] Appl. No.: 189,788

[22] Filed: May 3, 1988

[30] Foreign Application Priority Data

May 13, 1987 [JP] Japan .................................. 62-116509

[51] Int. Cl.⁴ .......................... G01D 5/34; H01J 3/14
[52] U.S. Cl. ........................... 250/231 SE; 250/237 G
[58] Field of Search .................... 250/231 SG, 237 G; 341/13; 356/395, 373; 33/125 A, 125 C

[56] References Cited

U.S. PATENT DOCUMENTS

| | | | |
|---|---|---|---|
| 3,187,187 | 6/1965 | Wingate | 250/231 SE |
| 3,326,077 | 6/1967 | Vandermeer | 250/231 SE |
| 4,451,731 | 5/1984 | Leonard | 250/237 G |
| 4,477,189 | 10/1984 | Ernst | 33/125 C |
| 4,602,155 | 7/1986 | LaPlante | 250/231 SE |
| 4,678,910 | 7/1987 | Hara et al. | 250/231 SE |
| 4,794,251 | 12/1988 | Scholian | 250/231 SE |

FOREIGN PATENT DOCUMENTS 0113108  6/1985  Japan .......................... 250/231 SE Primary Examiner—David C. Nelms
Assistant Examiner—Michael Messinger
Attorney, Agent, or Firm—Stevens, Davis, Miller & Mosher

[57] ABSTRACT

A reference signal generation apparatus for a position detector is disclosed in which a plurality of signals having peaks at predetermined intervals are produced from the light transmitted through slit rows of random patterns and a plurality of light detectors for detecting the same light, thereby producing a reference signal in the vicinity of maximum and minimum values of the difference signal between the output signals of the light detectors.

7 Claims, 11 Drawing Sheets

REFERENCE SIGNAL GENERATION APPARATUS FOR POSITION DETECTOR

BACKGROUND OF THE INVENTION

1. Field of the Invention

The present invention relates to a reference signal generation apparatus for a position detector of a positioning device.

2. Description of the Prior Art

Photoelectric encoders are widely used as position detectors of positioning devices. Such a photoelectric encoder comprises a moving slit plate adapted for rotary or linear motion and a fixed slit plate having a multiplicity of slits for generating counting signals and a reference signal, and operates to detect the position of an object by optically receiving pulse outputs from a plurality of light detectors. An example of such a conventional reference signal generation apparatus for a photoelectric encoder will be explained below with reference to accompanying drawings. FIG. 10 shows an outline of a conventional photoelectric encoder. Reference numeral 1 designates a moving slit plate in rotary motion, numeral 2 a light source, numeral 3 a fixed slit plate, numerals 4, 5, 6 light detectors, and numeral 7 a rotary member. Numeral 8 designates slits for generating a counting signal which are formed on the moving slit plate 1. Numeral 9 designates slits for generating a counting signal which are formed on the fixed slit plate in opposing relation to the slits 8. Numerals 10, 11, 12 and 13 designate slits for generating reference signals, of which the slits 10, 11 are formed on the moving slit plate 1, and the slits 12, 13 on the fixed slit plate 3. The slits 10 and 12 are arranged in opposing relation to each other so that the light from the light source reaches the light detector 4 therethrough. The slits 11 and 13 are also arranged in opposing relation to each other so that the light that has passed therethrough is detected by the light detector 5. The slits 8, 9 and the light detector 6 are also arranged in similar manner. FIG. 11 is an enlarged view of the slits 10 to 13 for generating the reference signals, and FIG. 12 a diagram for explaining the processing of an output signal of the light detectors 4, 5. Numeral 14 designates circuit means for producing a signal C making up the difference between a signal B produced from the light detector 4 and a signal A produced from the light detector 5. Numeral 15 designates circuit means for comparing the signal C with a threshold value D to produce a reference signal in pulse form when predetermined conditions are satisfied. FIG. 13 shows the signals plotted in a graph where the abscissa represents the lapse of time with the rotation of the moving slit plate 1 and the ordinate the values of the respective signals.

The operation of the photoelectric encoder configured as above will be explained below. The moving slit plate 1 is adapted for rotating integrally with the rotary member 7. In the process, the light passing through the slits 8, 9 are interrupted, thereby producing a counting signal output from the light detector 6. The slits for generating the reference signals are arranged at random as shown in FIG. 11, so that a peak output is produced only when two corresponding slits are overlapped in registration with each other. Specifically, the slits 11 and 13 are arranged the same way, and the signal A with a peak $P_1$ is produced from the light passing them. The slits 10, 12, on the other hand, are arranged with the light-interrupting portion and the light-transmitting portion thereof in opposing relation to each other for producing the signal B with a peak $P_2$. These slits and the light detectors are arranged in such a manner as to produce the peaks $P_1$ and $P_2$ substantially at the same time. The signal C, which is taken as a difference between the signals A and B, offsets the variations of the signals A and B caused by the changes in light quantity or noise components carried in each of the signals thereby to improve the anti-noise ability. This difference signal C is compared with a threshold value D, and when the value of the difference signal C is larger than the threshold value D, the reference signal is produced. If the threshold value D is set to a level associated only with the peak $P_3$ of the difference signal C but not with other peaks, it is possible to obtain a reference signal only at a position that is the position of the peak $P_3$. Also, in view of the fact that the difference signal C takes a waveform similar to a triangle in the vicinity of the peak $P_3$, the width of the reference signal is capable of being adjusted within a certain range by adjusting the value of the threshold D. Specifically, if the threshold value D is increased, the reference signal is reduced in width, while if the setting of the threshold value D is reduced, the width of the reference signal is increased. In the event that the threshold value D is set to an excessively large value, however, it becomes impossible to produce such a reference signal because of the decrease in the peak $P_3$ of the difference signal C. If the setting of the threshold value D is too small, by contrast, peaks other than the peak $P_3$ of the difference signal C which may have large amplitudes due to noise or the like exceed the threshold value D, thereby undesirably generating a reference signal associated with that particular position. As a result, values that are available as the threshold value D are limited to an appropriate range, and therefore the range of adjusting the width of the reference signal is also limited. Further, in the process of adjusting the width of a reference signal, the position thereof is also changed, thereby making it very difficult to adjust the position and width thereof independently of each other.

Explanation will be made now of another example of a conventional reference signal generation apparatus of a photoelectric encoder, which apparatus is different from the conventional apparatus described above. FIG. 14 shows a general configuration of such a conventional apparatus, in which the moving slit plate 1, the light source 2, and the fixed slit plate 3 are similar to those shown above respectively. Numerals 16 and 17 designate light detectors, numerals 18, 19, 20 slits, of which the slit 18 is formed in the moving slit plate 1, and the slits 19 and 20 in the fixed slit plate 3. The light detector 16 is in opposing relation to the slit 19, so that with the rotation of the moving slit plate 1, the slits 18 and 19 also come to be opposed thereto, with the result that the light from the light source 2 reaches the light detector 16 through the slits 18, 19. The light detector 17, and the slits 18, 20 are also constructed in similar manner. Each slit has a single opening, and the slits 19, 20 are formed in spaced relationship adjacent to each other. FIG. 15 is a diagram showing the processing of output signals of the light detectors 16 and 17. Numeral 21 designates circuit means for producing a signal G making up a difference signal between an output signal E of the light detector 16 and an output signal F of the light detector 17, and numeral 22 circuit means for producing a reference signal from the signal G. FIG. 16 shows a graph in which the abscissa represents the lapse of time with the rotation of the moving slit plate 1 and the ordinate the respective signals.

The operation of the reference signal generation apparatus configured as explained above will be described. The light detectors 16 and 17 both receive and produce the light passed through the slit 18. As a result, the signals E and F which make up outputs of the light detectors 16 and 17 respectively reach a peak output value after the lapse of as much time as required for the slit 18 to move between the slits 19 and 20. A signal G having a point of zero between the positive and negative maximum values is obtained as a difference between the signals E and F. A method has been used by which a point where the value of the signal G becomes zero is detected, and a reference signal is produced during a very short period from the instant of the particular detection. In this method, in order to specify a point where the signal G becomes zero, the signal G is compared with the threshold values H and I and positive and negative peaks detected to determine a point where the signal G becomes zero between the peaks.

This configuration, however, has a problem described below. First, in the conventional method first above described, if a reference signal corresponding to a high resolution is to be obtained, it is necessary to sharpen the peak $P_3$ with a reduced width thereof to reduce the minimum width of the slit. At the same time, the interval between the moving slit plate and the fixed slit plate is required to be shortened. This construction, however, is actually difficult to realize in view of the problem of assembly, slit contamination or damage due to dust. Also, in order to produce an output like signal A or B, the slit 10 is required to include an opaque part in the light-transmitting part thereof. The light from the light-transmitting part is liable to circumvent to other light-receiving parts, often adversely affecting the counting signal. For preventing this inconvenience, the slit 10 is required to be located in spaced relationship from the counting slit, thereby making it difficult to reduce the size of the apparatus as a position detector. In the second conventional apparatus described above with slits having a single opening, on the other hand, less luminous energy is transmitted, resulting in a decreased output and inferior signal-to-noise ratio. A method to solve his problem in keeping with the trend toward higher accuracy is by reducing the slit width and increasing the opening area. Such a method, however, has its own limitation as the apparatus is increased in size. Also, since a reference signal is produced only for a very short period of time from a point, the position of the reference signal undergoes a change depending on the direction of rotation.

SUMMARY OF THE INVENTION

Accordingly, the primary object of the present invention is to provide a reference signal generation apparatus for a position detector of high accuracy and high signal-to-noise ratio that can meet the trend toward a reduced apparatus size and higher resolution.

According to the present invention, there is provided a reference signal generation apparatus comprising a first slit section including a plurality of slits with different intervals or different widths on a moving slit plate, a second slit section of similar configuration on a fixed slit plate, a plurality of light detectors for detecting the light transmitted through the slit sections, circuit means for producing a difference signal between the output signals of the light detectors, and circuit means for producing a reference signal between the maximum and minimum values of the difference signal, wherein the light detectors and the slit sections are arranged in such a manner that each output of the light detectors takes a maximum value at predetermined intervals on the moving slit plate.

According to another aspect of the present invention, the first and second slit sections are so constructed that when one of the outputs of the light detectors takes a peak other than the greatest local maximum, the output of the other light detector also assumes a peak.

According to still another aspect of the present invention, the circuit means for producing a reference signal is so constructed that a reference signal is generated only during the period when the difference signal takes two different values between the maximum and minimum levels thereof.

According to a further aspect of the present invention, each of the first slit section and the second slit section is configured of a plurality of slit rows of different slit patterns each having slits of unequal intervals or unequal widths, and the light detectors detect the light transmitted through the slit rows of the first slit section and the second slit section.

According to a still further aspect of the present invention, each of the first slit section and the second slit section includes a plurality of slit rows of different inclination angles, each slit row of the second slit section having the same slit inclination angle as the corresponding slit rows of the first slit section.

According to a still further aspect of the present invention, the apparatus comprises a laser beam source, in which the moving slit plate, the fixed slit plate and the light detectors are arranged in such a manner that the bright/dark stripes of the Fraunhofer diffraction image formed by the slit section of the slit plate disposed on the side of the light source are radiated on the light detectors through the slit section of the slit plate disposed on the side of the light detectors.

According to the configuration described above, the light detectors detect the luminous energy transmitted in superposed relations through the first slit section and the second slit section having a plurality of slits of different intervals or different widths. As a result, the luminous energy thus detected is much larger than the one detected with slits of single opening, thereby leading to an improved S/N. Also, production of a difference signal between the outputs of the light detectors offsets the signal fluctuations due to noises for an improved S/N of the required peak value. The luminous energy transmitted through the first and second slit sections reaches a sharp peak point when the respective slit patterns coincide with each other, and the peak width corresponds to the slit width. It is thus possible to obtain a sharp, high peak, so that a large inclination is obtained of the difference signal between peaks in spaced relationship with each other. When a reference signal is produced as a given value of the difference signal, therefore, the peak width can also be increased to widen each slit width proportionately with the increase in transmitted luminous energy. As a consequence, the interval between the moving slit plate and the fixed slit plate can be widened, thereby reducing the change of damage on the one hand and facilitating the assembly and adjustment on the other. The large luminous energy also eliminates the need of a large opening, resulting in less light circumvention for a reduced apparatus size.

DESCRIPTION OF THE PREFERRED EMBODIMENTS

Figure 1:
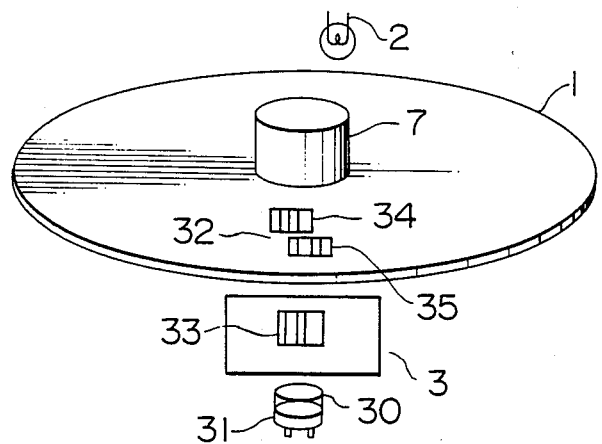
FIG. 1 is a schematic diagram showing a reference signal generation apparatus for a position detector according to a first embodiment of the present invention.
Figure 2:
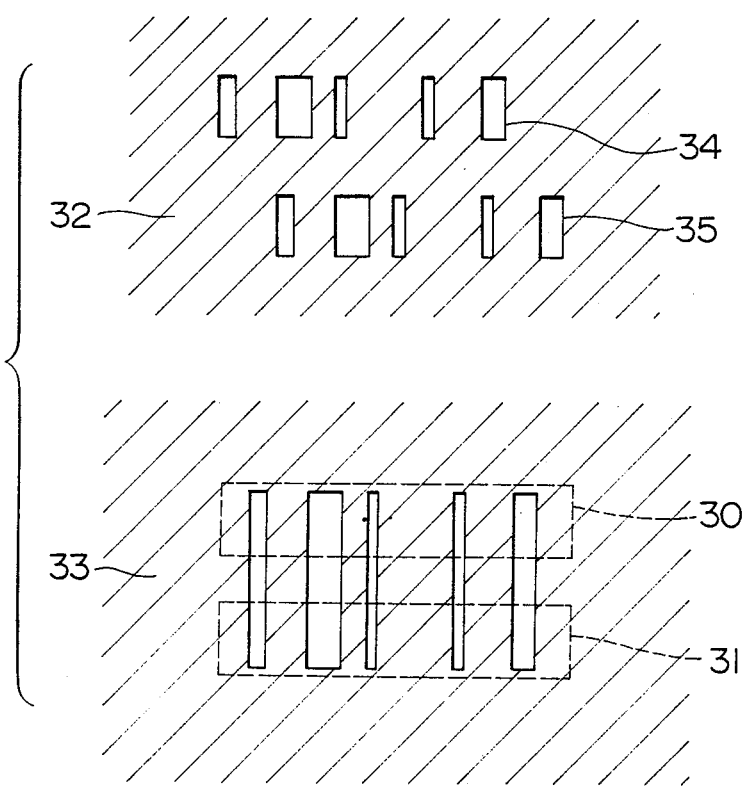
FIG. 2 is an enlarged view of the essential parts of the apparatus shown in FIG. 1.
Figure 3:
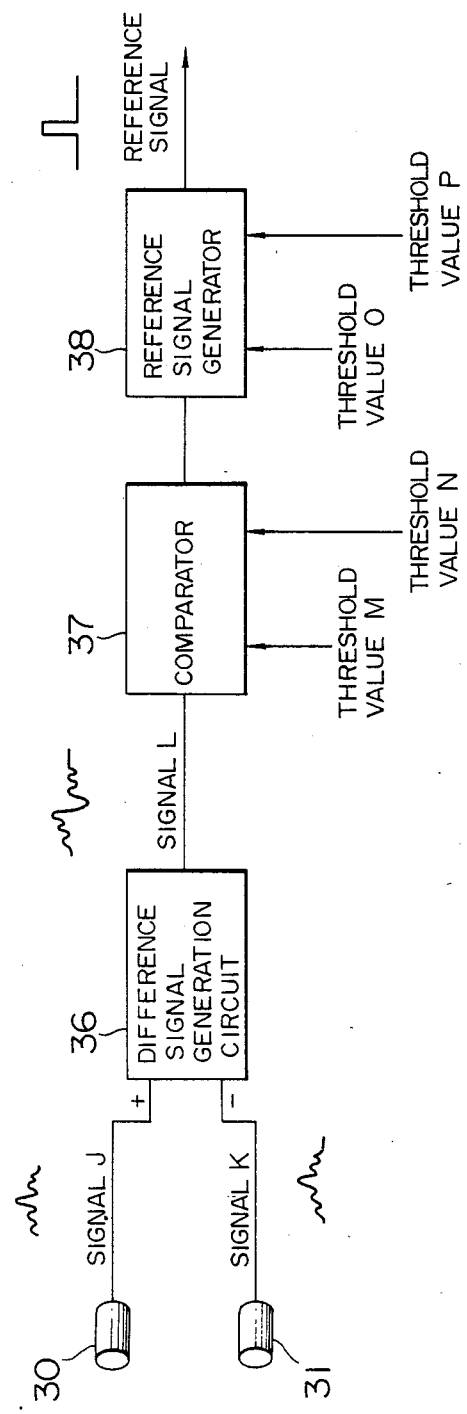
FIG. 3 is a diagram showing a signal processing system of the reference signal generation apparatus for a position detector according to the first embodiment.
Figure 4:
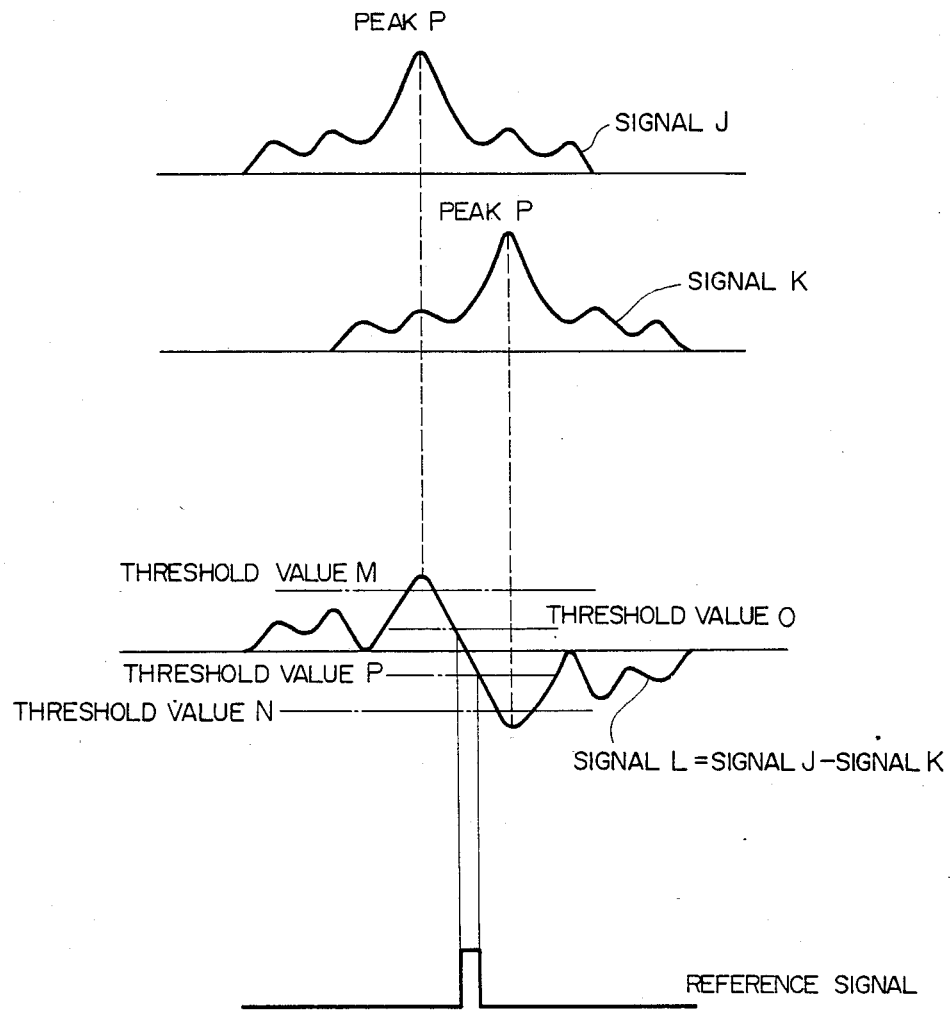
FIG. 4 shows signal waveforms produced in the apparatus of FIG. 1.

A reference signal generation apparatus for a position detector according to a first embodiment of the present invention will be explained with reference to the accompanying drawings. FIG. 1 schematically shows a reference signal generation apparatus for a position detector according to the first embodiment of the present invention. Numeral 1 designates a moving slit plate, numeral 2 a light source, numeral 3 a fixed slit plate, and numeral 7 a rotary member as in conventional similar apparatuses. Numerals 30, 31 designate light detectors. Numeral 32 designates a first slit section including a plurality of slit rows formed on the moving slit plate 1, and numeral 33 a second slit section including a plurality of slit rows formed on the fixed slit plate 3. FIG. 2 is an enlarged view of the essential parts of the first slit section 32 and the second slit section 33. The first slit section 32 includes two slits 34 and 35 which are displaced but have the same slit pattern. Also, the second slit section 33 has the same slit pattern as the first slit section 32 but with a different size. The light detector 30 is disposed at a position corresponding to the slit 34 and the second slit section 33, and the light detector 31 at a position corresponding to the slit 35 and the second slit section 33. FIG. 3 shows an output signal processing system for each of the light detectors. FIG. 4 is a diagram in which the abscissa represents the change of the moving slit plate with time as it rotates, and the ordinate the magnitude of each signal. Numeral 36 designates circuit means for determining a difference signal between the output signal J of the light detector 30 and the output signal K of the light detector 31, numeral 37 circuit means for determining the positive and negative maximum values of the difference signal L by comparing predetermined threshold values M and N with each other, and producing a signal only between the positions associated with the positive and negative maximum values of the difference signal L, and numeral 38 circuit means for producing a reference signal when the difference signal L takes a value between predetermined threshold values O and P while a signal is produced from the circuit means 37.

The operation of the reference signal generation apparatus for a position detector configured as above will be explained. The first slit section 32 and the second slit section 33 have a slit pattern with a plurality of slit rows. Only when corresponding slits, that is, the slit 34 and the second slit section 33, or the slit 35 and the second slit section 33 are superimposed in registry with each other, the luminous energy transmitted through the slits reaches a maximum as shown in FIG. 4 so that the output of a corresponding light detector has a peak P. In this random pattern arrangement of slits, only a low output is produced as compared with the peak P under conditions other than the case of superimposition described above. With the rotation of the moving slit plate 1, the first slit section 32 is superimposed on the second slit section 33, and the light detectors 30, 31 produce an output signal J and a signal K as shown in FIG. 4. The peak points of the signals J and K are displaced from each other by the amount of displacement between the slits 34 and 35, which amount depends on the magnitude of the peak P and the accuracy of the reference signal. After that, the circuit means 36 produces a signal L representing the difference between the signals J and K as shown in FIG. 4. Finally, a reference signal is determined from the difference signal L and the threshold values O and P. The circuit means 37 is inserted in order to specify such a reference signal to a single point. The circuit means 37 thus compares the positive and negative maximum values of the signal L by the use of the threshold values M and N, and is adapted to detect that the signal L is located between the positive and negative maximum levels from the signal value and the direction of rotation. Under such a condition, a reference signal is produced by the circuit means 38 from the signal L and threshold values O and P.

As described above, according to the embodiment under consideration, a difference between a plurality of signals produced by superimposition of the first slit section and the second slit section each including a plurality of slit rows is taken to meet the requirement of high accuracy to a degree greater the smaller the displacement between peak points of the light detector outputs and the greater the peaks thereof. Nevertheless, the use of a plurality of slits permits a larger output to be produced than in the second example of conventional apparatuses, while at the same time making it possible to set the displacement of peak positions as desired for an easier improvement in accuracy. Further, due to the inherent fact that a large output is capable of being produced, the size of the apparatus need not be increased to increase the output thereof, thereby making a compact, high-accuracy apparatus possible. Further, the production of the difference signal renders the apparatus more resistant to preceding disturbances such as noise or luminous energy fluctuations leading to an improved S/N. Furthermore, in spite of the resemblance of the slit rows of the first example of the prior art, the embodiment under consideration has an advantage over the first example of the prior art requiring fine slits to improve the accuracy causing the above-mentioned problem. Specifically, in the embodiment under consideration, an improved accuracy is related to the amount of displacement of peak positions of outputs of a plurality of light detectors, and the accuracy of the slits has less importance. As a result, it is possible to use slits comparatively low in fineness, which in turn permits a wider distance between the moving slit plate and the fixed slit plate for an improved reliability. Also, unlike in the first example of the prior art in which two patterns, positive and reverse, of the output of light detectors are required thereby posing the problem of the circumvention of light at the bright part of slits, the embodiment under consideration is free of such an inconvenience and can produce a stable output without any bulky equipment, thereby making a suitable application for high-reliability and compact apparatus.

On the other hand, the use of circuit means for producing a reference signal indicating the position of the origin between two different threshold values in a section between the maximum and minimum values of the difference signal permits the width and position of the reference signal to be set fixed as desired, without changing the position depending on the rotational direction unlike in the second example of the prior art, thereby improving stability and reliability.

Figure 5:
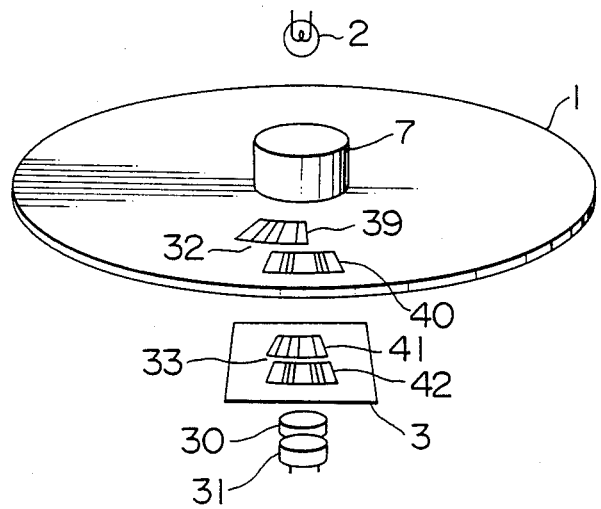
FIG. 5 is a diagram schematically showing a reference signal generation apparatus for a position detector according to a second embodiment of the present invention.
Figure 6:
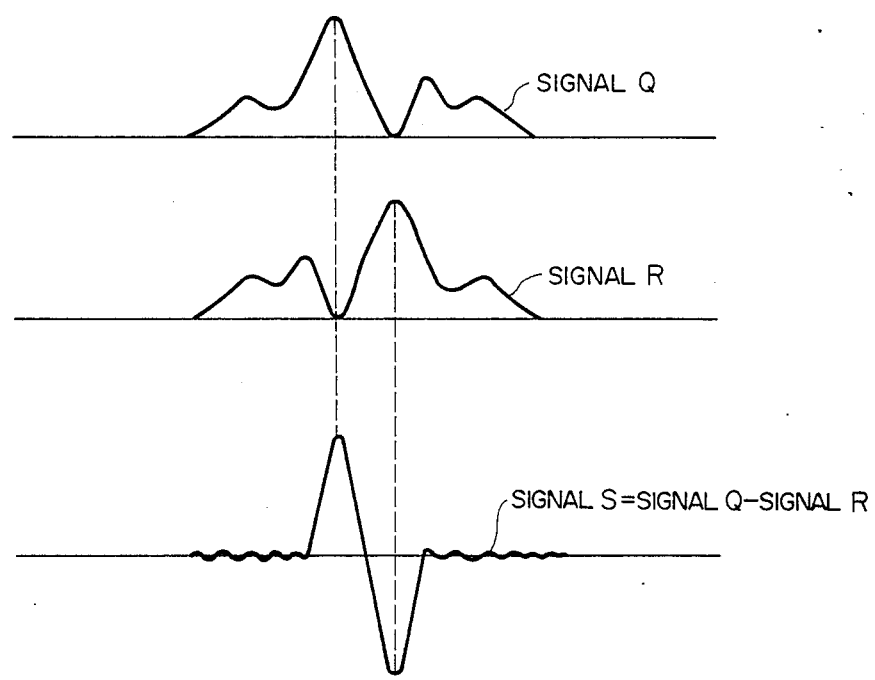
FIG. 6 is a diagram showing signal waveforms produced in the apparatus of FIG. 5.

Now, a second embodiment of the present invention will be explained with reference to the accompanying drawings. FIG. 5 is a schematic diagram showing a reference signal generation apparatus for a position detector according to the second embodiment of the present invention. This embodiment is different from the first embodiment shown in FIG. 1 only in the first slit section 32 and the second slit section 33, and the other parts are identical to those in the first embodiment. Specifically, the first slit section 32 is comprised of slits 39 and 40, and the second slit section 33 of slits 41 and 42, each slit section including a plurality of slits. The light detector 30 is arranged to correspond to the light passed through the slits 39 and 41, and the light detector 30 to the light passed through the slits 40 and 42. FIG. 6 is a diagram showing changes in each signal value with time plotted along abscissa, indicating an output signal Q of the light detector 30, an output signal R of the light detector 31 and a difference signal S therebetween. The position where the signal Q reaches a peak is the one where the slits 39 and 41 register with each other, while the position where the signal R reaches a peak is the one where the slits 40 and 42 are in registry with each other. Peaks are thus reached at predetermined intervals. The slits 39 and 41 are configured the same way, and the slits 40 and 42 have the same configuration. In spite of this, the slits 39 and 41 are constructed in a way different from the slits 40 and 42 in a manner to produce different signals respectively. The slits are so constructed that when one of the signals Q and R reaches a peak, the other takes a local maximum value, while in other regions, all signals take substantially the same value.

As described above, the first slit section and the second slit section are so configured that peaks other than the maximum values of the outputs of a plurality of light detectors are cancelled by other peaks as a result of determining the difference signal, so that the parts other than the maximum peak required for the reference signal, that is, those parts of which are liable to degrade the signal-to-noise ratio due to noise or the like are offset with each other in the difference signal, thus attaining a high noise resistance with a high signal-to-noise ratio. Further, a better result is obtained the apparatus is configured in such a manner that the output of one of the light detectors takes a local minimum value when the output of the other light detector is at maximum.

Figure 7:
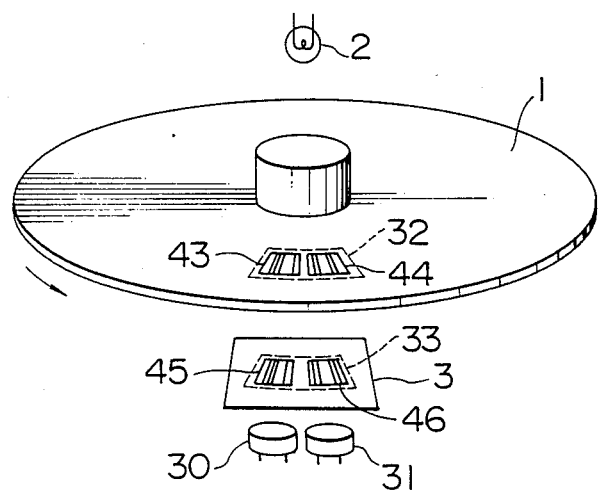
FIG. 7 is a schematic diagram showing a reference signal generation apparatus for a position detector according to a third embodiment of the present invention.
Figure 8:
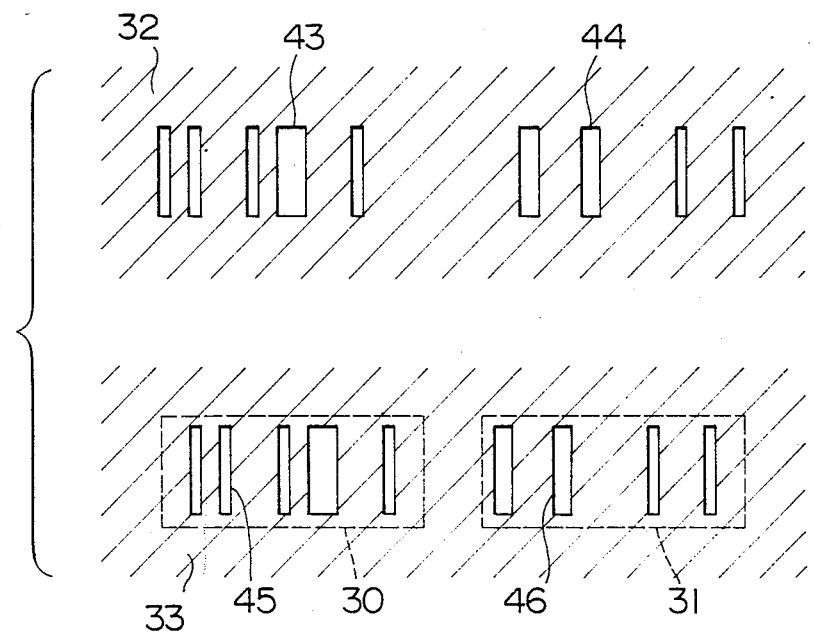
FIG. 8 is an enlarged view of the essential parts of the apparatus shown in FIG. 7.

Now, a third embodiment of the present invention will be explained. FIG. 7 is a schematic diagram showing a reference signal generation apparatus for a position detector according to the third embodiment of the present invention. FIG. 8 is an enlarged view of the essential parts of a slit plate used with such an apparatus. The moving slit plate 1, the light source 2, the fixed slit plate 3, the light detectors 30, 31, the first slit section 32, and the second slit section 33 are similar to those included in the first embodiment of FIG. 1. The embodiment under consideration is different from the first embodiment in the configuration of the first slit section 32 and the second slit section 33 and the arrangement of the light detectors 30 and 31. Specifically, the first slit section 32 is made up of a slit row 43 and a slit row 44, and the second slit section 33 of a slit row 45 and a slit row 46. The slit row 43 corresponds to the slit row 45, and the light passed therethrough is detected by the light detector 30. The slit row 44 corresponds to the slit row 46, and the light passed therethrough is detected by the light detector 31. The slit rows 43 and 44 are arranged in alignment along the direction of the moving slit plate 1, that is, on the circumference thereof. The slit rows 45 and 46 are also arranged in similar manner.

The operation of a reference signal generation apparatus for a position detector configured as above will be described. The combination of the slit rows 43 and 45 is arrange in a random pattern different from the combination of the slit rows 44 and 46. As a result, when the slits in a combination, that is, the slits 43 and 45, for instance, come into registry with each other, the opening area is increased. Otherwise, that is, even when the slits 43 and 46 are in registry, the opening area is not increased as much as when slits rows in a combination register with each other. As long as the first slit section is not superimposed on the second slit section 33, therefore, the light is cut off and no output is produced from the light detector 30 with the rotation of the moving slit plate 1. With the rotation in the direction indicated by arrow in FIG. 7, the slit 45 comes to be superimposed first on the slit 44 but the slit patterns thereof fail to coincide with each other with a small amount of luminous energy, thereby producing only a small output. The slit 45 then comes to overlap on the slit 43, in which case the slit patterns may coincide resulting in a maximum amount of luminous energy with a peak output signal. The same matter can be said of the light detector 31, so that each light detector is adapted to produce a peak output once every rotation of the moving slit plate. The slits are arranged in such a manner as to produce peak outputs at positions spaced by a predetermined length. The peak signals of a plurality of light detectors thus obtained are processed in the same manner as in the first and second embodiments and therefore will not described any more.

As described above, according to the present embodiment, each of the first slit section and the second slit section are comprised of a plurality of slit rows having different slit patterns, and therefore the slits associated with a plurality of light detectors may be arranged in superposition on each other. As a consequence, the light detectors may be arranged in series along the direction of motion of the moving slit plate, thereby making it possible to reduce the size of the whole apparatus.

Figure 9:
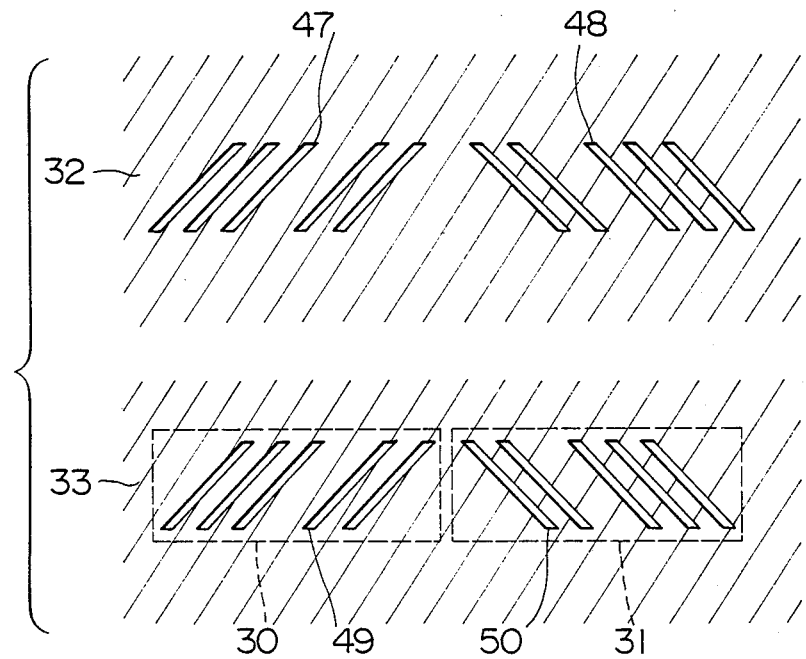
FIG. 9 is a diagram showing an enlarged view of the essential parts of a reference signal generation apparatus for a position detector according to a fourth embodiment of the present invention.
Figure 10:
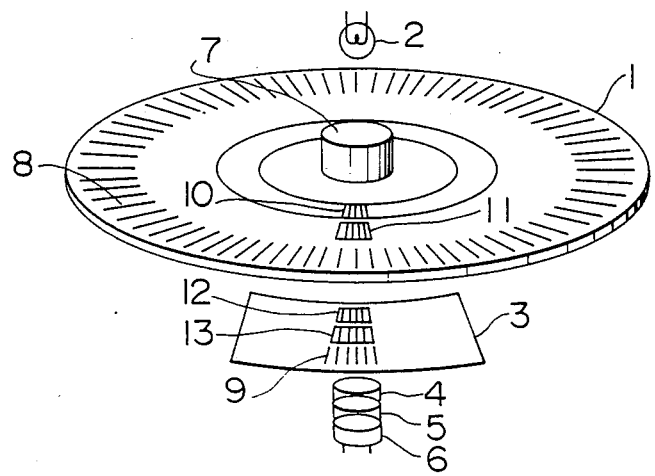
FIG. 10 is a diagram schematically showing a reference signal generation apparatus for a position detector according to a first example of the prior art.
Figure 11:
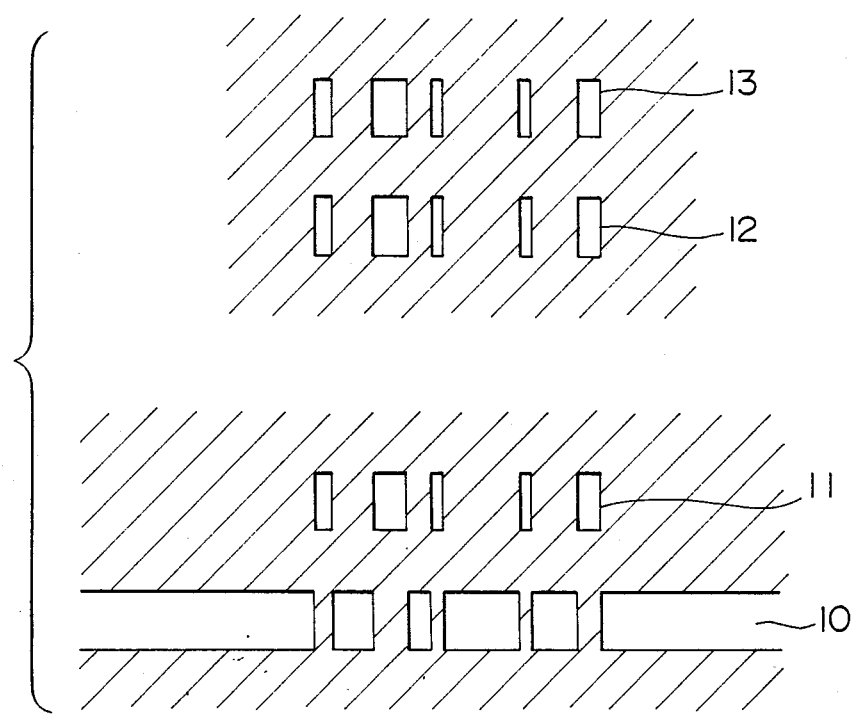
FIG. 11 is an enlarged view of the essential parts of the apparatus shown in FIG. 10.
Figure 12:
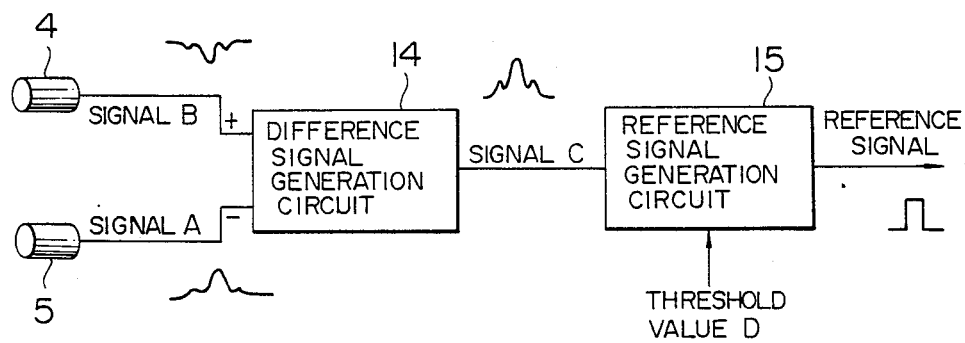
FIG. 12 is a diagram showing a signal processing system in the apparatus of FIG. 10.
Figure 13:
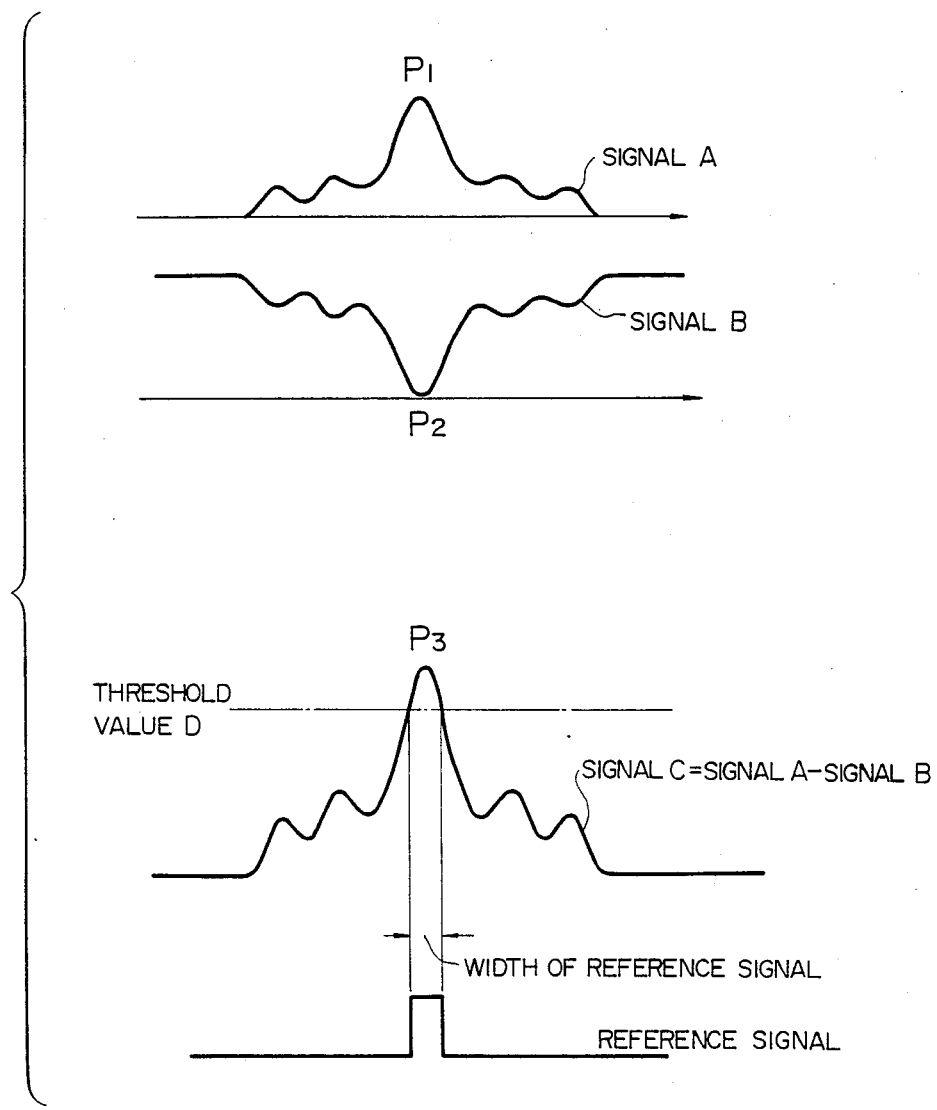
FIG. 13 shows signal waveforms produced in the apparatus of FIG. 10.
Figure 14:
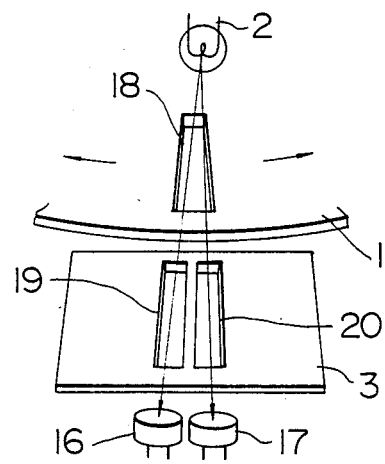
FIG. 14 is an enlarged view of the essential parts of a reference signal generation apparatus for a position detector according to a second example of the prior art.
Figure 15:
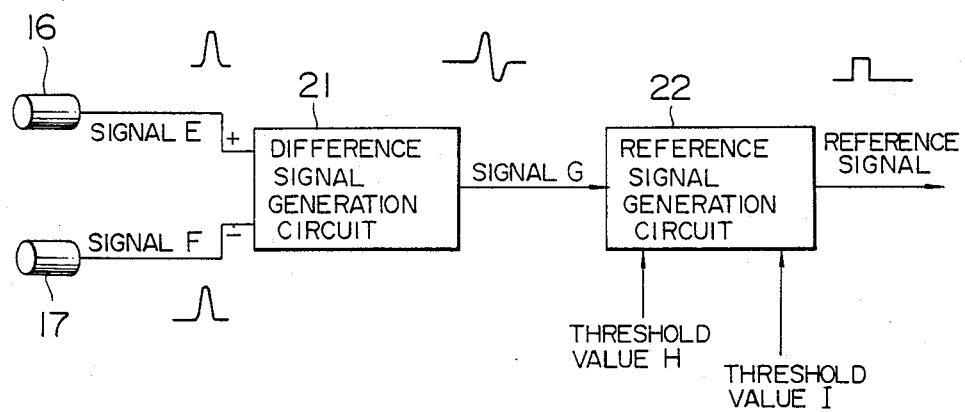
FIG. 15 is a diagram showing a signal processing system of the apparatus shown in FIG. 14.
Figure 16:
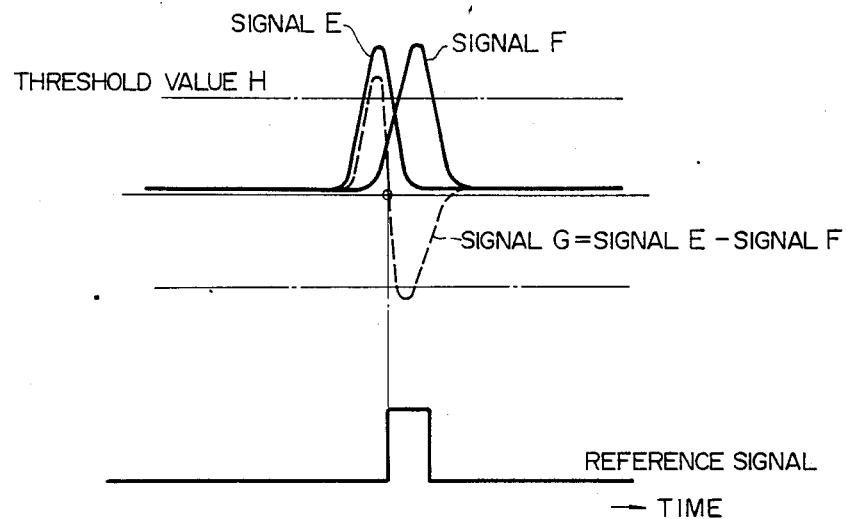
FIG. 16 shows signal waveforms produced in the apparatus of FIG. 14.

A fourth embodiment of the present invention will be explained. FIG. 9 is an enlarged view of the essential parts of a reference signal generation apparatus for a position detector according to a fourth embodiment of the present invention, including a first slit section 32 and a second slit section 33. This embodiment is different from the third embodiment of the invention in that the slit rows making up the first slit section 32 and the second slit section 33 are differently configured. The other parts remain the same as in the aforementioned embodiments. Specifically, numerals 47, 48 designate slit rows making up the first slit section 32, and numerals 49, 50 slit rows making up the second slit section 33. The slit rows 47 and 49 correspond to each other, and when they come into registry with each other, the maximum amount of luminous energy is transmitted, thereby causing the light detector 30 receiving the light to produce a peak output. The slit rows 48 and 50 are also similarly related to tee light detector 31. The slit rows 47 and 49 are slanted at an angle to the direction of motion of the moving slit plate 1, and the slit rows 48 and 50 slanted at another angle thereto.

The operation of the reference signal generation apparatus for a position detector configured as above will be explained. In this embodiment, as in the third embodiment, a large luminous energy of light is transmitted when corresponding slit patterns are superposed in registry with each other, and the light transmitted is very little or nil otherwise. This embodiment has the slit patterns configured at different angles, and therefore slit rows of different slit patterns such as the slits 47 and 50 are overlapped on each other, only the centers of the crossing which is very small area thereof come into registry with each other. As a result, the output of the small output portion which otherwise would constitute noise is further reduced for an improved signal-to-noise ratio. In the third embodiment of the invention, slit rows are prevented from coming into registry with each other by different intervals of slits included in slit rows. This arrangement required the design of at least two slit rows for obtaining the maximum value of luminous energy transmitted in peak form while at the same time being prevented from producing peak outputs. This design work was a troublesome task. Also, direct application of the slit rows for producing an output signal according to the second embodiment to the third embodiment with two types of slit rows may be sufficiently effective. According to the embodiment under consideration in which slits come into registry with each other due to the forms of the slits themselves, however, such inconveniences as mentioned above with other embodiments are eliminated to facilitate the design of slit rows and it is possible to arrange slits in more proper way.

As described above, if a plurality of slit rows are arranged at different angles, the signal-to-noise ratio is improved and the design of slit rows simplified.

Figure 17:
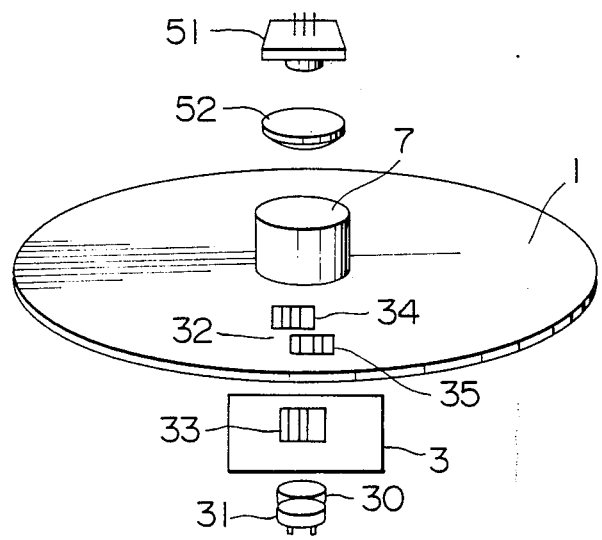
FIG. 17 is a schematic diagram showing a reference signal generation apparatus for a position detector according to a fifth embodiment of the present invention.
Figure 18:
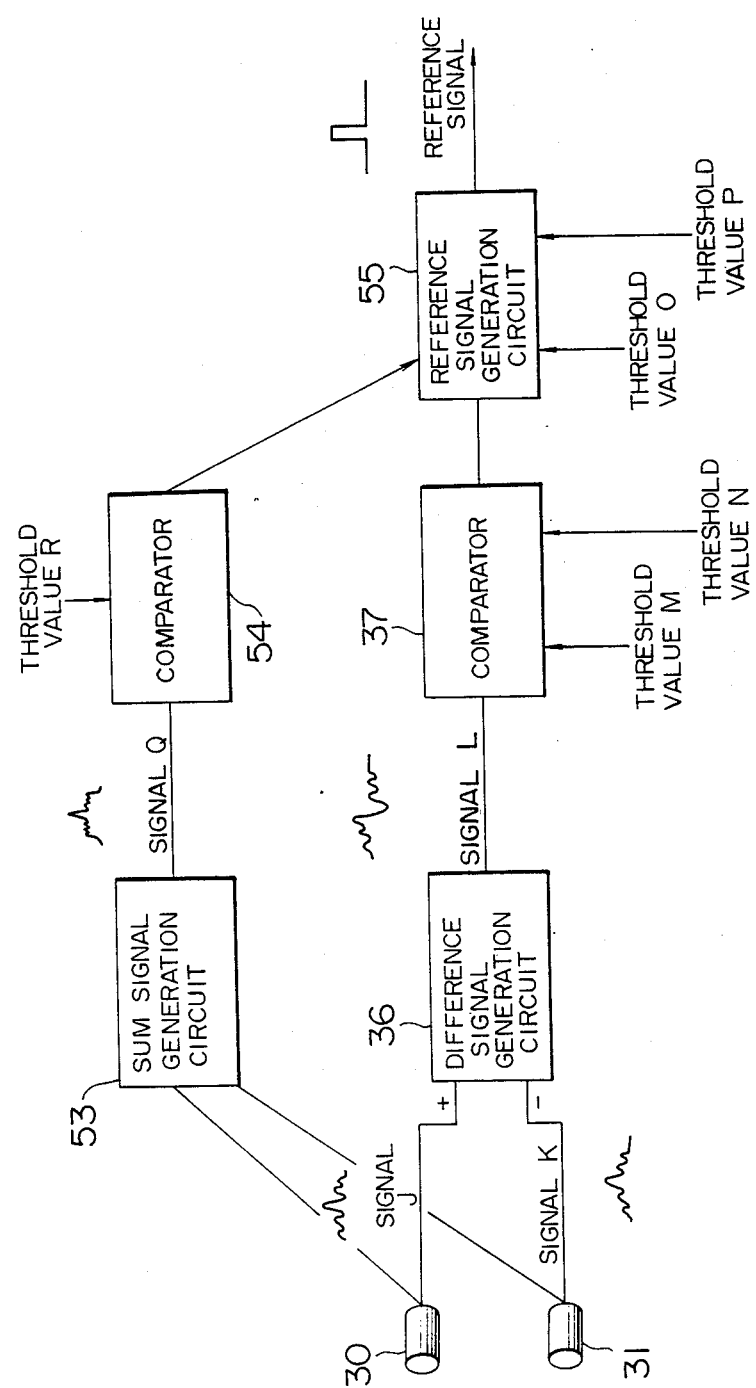
FIG. 18 is a diagram showing a signal processing system for a reference signal generation apparatus for a position detector according to a seventh embodiment of the present invention.

Now, a fifth embodiment of the present invention will be explained. FIG. 17 is a schematic diagram showing a reference signal generation apparatus for a position detector according to the fifth embodiment of the invention. This embodiment is different from the first embodiment shown in FIG. 1 in the light source thereof while the other parts remain the same. Specifically, the light source 2 in FIG. 1 is replaced with a laser diode 51, and a collimator lens 52 for converting the light from the light-emitting surface of the laser diode 51 into parallel luminous fluxes. The laser diode 51 and the colimeter lens 52 are arranged in such a manner that bright/dark stripes of the Fraunhofer diffraction image formed by the slit section on the moving slit plate 1 are radiated on a light detector through the slit section on the fixed slit plate 3. FIG. 18 is a diagram showing an output signal processing system for each light detector. This system is different from the one included in the first embodiment of FIG. 3 that the embodiment under consideration further comprises circuit means 53 for producing a sum Q of the output signal J of the light detector 30 and the output signal K of the light detector 31, circuit means 54 for comparing the sum signal Q with a predetermined threshold value R and producing an output signal only when Q is larger than R, and circuit means 55 in place of the circuit means 38 for producing an output, that is, a reference signal only in response to the output of the circuit means 54.

The operation of the reference signal generation apparatus for a position detector configured as above will be explained. First, the light from the light-emitting surface of the laser diode 51 is converted into parallel light fluxes through the colimeter lens 52, which fluxes are radiated on the periodical slit rows on the moving slit plate 1, so that bright/dark stripes with a bright part in the form of narrow, sharp beam generated as a Fraunhofer diffraction image through the slits of the slit row is projected on the fixed slit plate 3. The bright/dark stripes are detected by the light detectors to produce a position detection signal and a reference signal generating signal. The component elements of the embodiment before the output signals J, K of the light detectors 30, 31 are processed by the circuit means 36, 37 and applied as input signals to the circuit means 55 are identical to those corresponding parts in the first embodiment of the invention. A sum signal of the output signals J and K is obtained as a signal Q from the circuit means 53, which signal takes a maximum value intermediate the peaks P of the two signals J and K in FIG. 4. The peak of the signal Q is compared with a predetermined threshold value R, and when R is smaller than Q, that is, when at about a point intermediate the peaks of the signals J and K, the circuit means 54 produces an output signal. During the period when this signal is produced at the same time as the output signal of the circuit means 37, a reference signal is produced by the circuit means 55 from the signal L and the threshold values O and P.

In this way, according to this embodiment, a laser light source and a Fraunhofer diffraction image due to a periodical slit row are used to detect light, and therefore the interval between the moving slit plate and the fixed slit plate can be widened without increasing the slit pitches, with the result that a greater distance between the slit plates reduces the danger of damage and improves the assembly efficiency. At the same time, the slit pitch can be reduced without shortening the interval between the slit plates, thereby reducing the size and improving the accuracy of the position detector. Another advantage of this embodiment lies in that a sum signal of the output signals of the light detectors is used in such a manner that a logic sum of the conditional result of the value of a sum signal and that of a difference signal is determined in the circuit means 55 to thereby produce the reference signal, so that as compared with the signal processing means included in the first embodiment of the invention, there is no need to consider the direction of motion of the moving slit plate, thus simplifying the circuit configuration. As a consequence, the cost and size of the apparatus are reduced with an improved reliability.

In place of a position detector having a moving slit plate adapted for rotary motion as in each of the above-described embodiments, a position detector involving linear motion may be used with equal effect. Also, any combinations of the first embodiment to the fifth embodiment may be used. Further, the patterns of slit rows are not limited to those specifically illustrated in each of the embodiments but may take other forms as far as the functions required of them are achieved. Furthermore, instead of the slit configuration of the first embodiment in which the second slit section 33 of each of the two light detectors includes a single slit row due to the fact that the interval between peak values of the outputs of the light detectors is determined by the first slit section 32 and the slit row 34 is identical to the slit row 35, another configuration with two different slit rows may be employed or the second slit section 33 may be inverted in construction from the first slit section 32. This is also the case with other embodiments.

The circuit means described in each of the embodiments are not limited to those configurations but may be sufficient if they have the functions described. Also, in the second embodiment of the invention, the output signals of the light detectors assume almost the same value at other than the maximum values thereof in order to attain the full offsetting effect in the difference signal although the full offsetting effect may not always be attained depending on the random slit pattern of the first slit section and the second slit section. What is intended in the second embodiment, however, is to offset or cancel out an unnecessary signal component by another signal component, and it is of course dependent upon the above idea that if an unnecessary peak is contained in one signal, a peak signal to offset such an unnecessary peak is added to another signal.

In spite of the fact that the corresponding parts of the first slit section and the second slit section in each of the above-mentioned embodiments have the same slit pattern, different slit rows may be constructed in the first and second slit sections. Especially if the third embodiment is so combined with the second embodiment that the slit rows making up the slit sections are superimposed in arrangement, the first slit section comes to have a slit pattern quite different from that of the second slit section. Also, in the second embodiment, if slits for offsetting in each slit pattern are added, the first and second slit sections make up slit rows having different slit patterns.

In addition, the Fraunhofer diffraction image of the laser beam in the fifth embodiment may be formed not by reference signal generating slits but by the position detecting slit row. In such a case, with respect to the position detecting slit rows, the distance between the moving slit plate and the fixed slit plate may be widened by the effect of the Fraunhofer diffraction image described with reference to the fifth embodiment, while with respect to the reference signal generating slit rows, the same distance can be increased by the effect explained with reference to the first embodiment, thus producing a balanced position detector. Also, the fifth embodiment in which the circuit means 37 compares the signal L with the threshold values M and N to produce an output signal in the vicinity of the maximum and minimum values of the difference signal L, may be simplified by excluding the circuit means 55 for taking a logic sum to the extent that the output signal of the circuit means 54 providing the result of comparison between the sum signal Q and the threshold value R is obtained only in the vicinity thereof. In short, it is sufficient if the vicinity of the maximum and minimum values of the difference signal L is specified from the logic sum of the signals obtained from the sum signal and the difference signal.

As explained above, according to the first aspect of the present invention, there is provided the reference signal generation apparatus for a position detector, comprising the first slit section having a plurality of slits of unequal widths or intervals on the moving slit plate, the second slit section of a similar construction on the fixed slit plate, a plurality of light detectors for detecting the light transmitted through the slit sections, circuit means for determining the difference signal of the output signals of the light detectors, and circuit means for generating a reference signal between the maximum and minimum values of the difference signal, wherein the light detectors and the slit sections are arranged in such a way that the outputs of the light detectors take a maximum value at predetermined intervals on the moving slit plate, whereby the outputs of the light detectors for transmitting the light at superposed portions of the first and second slit sections exhibit a large sharp level, and the production of the difference signal improves stability against noise and fluctuations in luminous energy for an improved signal-to-noise ratio and reliability. At the same time, a large maximum inclination of the difference signal is obtained to produce a highly accurate reference signal. Also, the slits may be widened thereby to make it possible to to increase the distance between the moving slit plate and the fixed slit plate, thereby reducing the change of damage and simplifying the assembly adjustment. Further, there is no need of forming a large opening unlike in the first example of the prior art described above, thereby eliminating the light circumvention for a reduced size of the apparatus.

According to the second aspect of the invention the first and second slit sections are configured in such a manner that when one of the outputs of the light detectors in the first aspect of the invention reaches a peak other than the highest maximum level, the output of the light detector also reaches a similar peak, whereby the peaks other than the highest maximum and minimum levels of the difference signal may be reduced for an improved signal-to-noise ratio and reliability. Also, if the slit sections are configured to offset peaks other than the required ones, the freedom of arrangement of the slit sections is increased thereby to reduce the apparatus size.

According to the third aspect of the present invention, the circuit means for generating the reference signal from the difference signal is so configured that the reference signal is generated only during the period between two different values taken between the maximum and minimum values of the difference signal, whereby a fixed production of the reference signal is attained regardless of the direction of rotation, and by setting two values, the position and duration of the reference signal may be set in fine adjustment.

According to the fourth aspect of the present invention, each of the first slit section and the second slit section is made up of a plurality of slit rows each with a plurality of slits of different intervals or widths in different slit patterns, so that the light transmitted through the slit rows of the first slit section and the second slit section are detected by the light detectors, whereby a peak output is produced when the slit patterns coincide with each other or have a number of common parts. This configuration permits an arrangement in which different slit rows are superimposed and the slit rows may be arranged along the direction of motion of the moving slit plate, thereby reducing the size of the apparatus. Also, the light detectors produces different outputs from different slit rows, and therefore an optimum difference signal is obtained from combinations of the outputs.

According to the fifth aspect of the present invention, each of the first and second slit sections in the fourth aspect of the invention is configured of a plurality of slit rows with a slit angle different from those of the aforementioned case, and the corresponding slit rows of the first and second slit sections have the same slit inclination angle, whereby a sharp peak is obtained only when the slit rows of the same slit inclination face each other. This makes possible an arrangement in which a plurality of like slit patterns are superimposed on each other for a reduced size of the apparatus. Also, the increased freedom of design of the pattern of slit rows contributes to an optimized and simplified configuration of the apparatus.

According to the sixth aspect of the present invention, bright/dark stripes due to the Fraunhofer diffraction image formed by laser beam and periodical slit rows are detected, whereby it is possible to widen the distance between the moving slit plate and the fixed slit plate and hence the slit pitches, thereby reducing the change of the damage to the apparatus, simplifying the assembly and adjustment of the apparatus, while at the same time reducing the size and improving the accuracy due to the reduced slit pitches.

We claim:

1. In a photoelectric position detector with a moving slit plate and a fixed slit plate arranged between a light source and a plurality of light detectors, a reference signal generation apparatus comprising:
    at least first and second slit sections spaced from each other and each comprising a plurality of slits of different intervals or different widths formed in said moving slit plate;
    a third slit section comprising a plurality of slits formed in said fixed slit plate, said third slit section being positioned to meet said first and second slit sections sequentially as said moving slit plate moves for transmitting light from said light source therethrough with movement of said moving slit plate relative to said fixed plate;
    said plurality of light detectors corresponding to said at least first and second slit sections and detecting light transmitted through said slit sections to produce respective detector output signals corresponding to said at least first and second slit sections, each of said output signals respectively having a maximum value at predetermined intervals produces by the the motion of said moving slit plate;
    circuit means for producing a difference signal from said detector output signals, said difference signal having one maximum value and one minimum value, said circuit means for producing said difference signal defining maximum and minimum levels for said difference signal; and
    circuit means for producing a reference signal having a timing which occurs in a time period defined between timings of said defined maximum and minimum levels of said difference signal.

2. In a photoelectric position detector with a moving slit plate and a fixed slit plate arranged between a light source and at least two light detectors, a reference signal generation apparatus comprising:
    at least first and second slit sections spaced from each other and each comprising a plurality of slits of different intervals or different widths formed in said moving slit plate;
    a third slit section comprising a plurality of slits formed in said fixed slit plate, said third slit section being positioned to meet said first and second slit sections sequentially as said moving slit plate moves for transmitting light from said light source therethrough with movement of said moving slit plate relative to said fixed plate;
    said at least two light detectors corresponding to said at least first and second slit sections and detecting light transmitted through said slit sections to produce respective detector output signals corresponding to said at least first and second slit sections, each of said output signals respectively having a peak value at predetermined intervals produced by the motion of said moving slit plate, wherein the slits of said slit sections are configured in such a manner that when the output of a first one of said light detectors reaches a peak value other than a possible highest peak value, the output of a second one of said light detectors also reaches a peak value;
    circuit means for producing a difference signal from said detector output signals, said difference signal having one maximum value and one minimum value, said circuit means for producing a difference signal defining maximum and minimum levels for said difference signal; and
    circuit means for producing a reference signal having a timing which occurs in a time period defined between timings of said defined maximum and minimum levels of said difference signal.

3. A reference signal generation apparatus according to claim 2, wherein the first slit section and the second slit section are so configured that when the output of one of the detectors takes a maximum value, the output of the other light detector takes a local minimum value, and otherwise the outputs of the light detectors are substantially equal to each other.

4. In a photoelectric position detector with a moving slit plate and a fixed slit plate arranged between a light source and a plurality of light detectors, a reference signal generation apparatus comprising:
   first and second slit sections spaced from each other and each comprising a plurality of slits formed in said moving slit plate;
   a third slit section comprising a plurality of slits formed in said fixed slit plate, said third slit section being positioned to meet said first and second slit sections sequentially as said moving slit plate moves for transmitting light from said light source therethrough with movement of said moving slit plate relative to said fixed plate;
   said plurality of light detectors corresponding to said at least first and second slit sections and detecting the light transmitted through said slit sections to produce respective detector output signals corresponding to said first and second slit sections, each of said output signals respectively having a maximum amplitude value at predetermined intervals produced by the motion of said moving slit plate;
   circuit means for producing a difference signal from said detector output signals, said difference signal having one maximum value and one minimum value, said circuit means for producing a difference signal defining maximum and minimum amplitude levels for said difference signal; and
   circuit means for producing a reference signal continuing only during a time period defined by two signal timings of said difference signal which exist when the difference signal is between two different amplitude levels located between said defined maximum and minimum amplitudes of the difference signal.

5. A reference signal generation apparatus for a position detector according to claim 4, further comprising a circuit for producing a sum signal of the output signals of the light detectors, and circuit means for producing a reference signal indicating a reference position only when the difference signal takes two different values between the maximum and minimum levels of the difference signal the vicinity of a local maximum point of the sum signal.

6. In a photoelectric position detector with a moving slit plate and a fixed slit plate arranged between a light source and a plurality of light detectors, a reference signal generation apparatus comprising:
   a first slit section including a plurality of slit rows each comprising a different slit pattern and a plurality of slits of different intervals or different widths formed in said moving slit plate;
   a second slit section including a plurality of slit rows each comprising a different slit pattern formed in said fixed slit plate, said plurality of slit rows of said second slit section being positioned to respectively meet said plurality of slit rows of said first slit section sequentially as said moving slit plate moves for transmitting light from said light source therethrough with movement of said moving slit plate relative to said fixed plate;
   said plurality of light detectors respectively corresponding to the slit rows and detecting light transmitted through the slit rows to produce respective detector output signals corresponding to said slit rows of said first slit section, each of said output signals having a maximum value at predetermined intervals produced by the motion of said moving plate;
   circuit means for producing a difference signal from said detector output signals, said difference signal having one maximum value and one minimum value, said circuit means for producing said difference signal defining maximum and minimum levels for said difference signal; and
   circuit means for producing a reference signal having a timing which occurs in a time period defined between timings of said defined maximum and minimum levels of said difference signal.

7. A reference signal generation apparatus for a position detector according to claim 6, wherein the first slit section and the second slit section are configured in such a manner that when the output of one of the light detectors assumes a maximum value, the output of the other light detector takes a local minimum value, and otherwise the outputs of the light detectors are substantially equal to each other.

* * * * *